(12) United States Patent
Watanabe et al.

(10) Patent No.: US 7,285,368 B2
(45) Date of Patent: Oct. 23, 2007

(54) POLYMERIZABLE ESTER HAVING SULFONAMIDE STRUCTURE, POLYMER, RESIST COMPOSITION AND PATTERNING PROCESS

(75) Inventors: Takeru Watanabe, Niigata-ken (JP); Takeshi Kinsho, Niigata-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 282 days.

(21) Appl. No.: 10/864,424

(22) Filed: Jun. 10, 2004

(65) Prior Publication Data
US 2005/0003303 A1 Jan. 6, 2005

(30) Foreign Application Priority Data
Jun. 12, 2003 (JP) ............................. 2003-167524

(51) Int. Cl.
*G03C 1/00* (2006.01)

(52) U.S. Cl. .................. 430/270.1; 526/286; 526/319; 526/310; 526/242

(58) Field of Classification Search ............. 430/270.1; 526/286, 319, 242, 310
See application file for complete search history.

(56) References Cited

U.S. PATENT DOCUMENTS

| | | | |
|---|---|---|---|
| 5,612,169 A * | 3/1997 | Eichhorn et al. ........ | 430/270.1 |
| 5,843,624 A | 12/1998 | Houlihan et al. | |
| 6,004,724 A | 12/1999 | Yamato et al. | |
| 6,261,738 B1 | 7/2001 | Asakura et al. | |
| 6,511,787 B2 * | 1/2003 | Harada et al. ........... | 430/270.1 |
| 6,537,725 B2 * | 3/2003 | Kunita et al. ............ | 430/270.1 |
| 6,555,289 B2 * | 4/2003 | Sasaki et al. ............ | 430/270.1 |
| 6,555,291 B1 * | 4/2003 | Hauck ........................ | 430/302 |
| 6,573,022 B1 * | 6/2003 | Miyake et al. ........... | 430/270.1 |
| 6,576,392 B1 * | 6/2003 | Sato et al. ................ | 430/270.1 |

FOREIGN PATENT DOCUMENTS

| | | |
|---|---|---|
| JP | 4-39665 A | 2/1992 |
| JP | 9-95479 A | 4/1997 |
| JP | 9-208554 A | 8/1997 |
| JP | 9-230588 A | 9/1997 |
| JP | 10-10739 A | 1/1998 |
| JP | 2000-314956 A | 11/2000 |

\* cited by examiner

*Primary Examiner*—Cynthia H. Kelly
*Assistant Examiner*—Connie P. Johnson
(74) *Attorney, Agent, or Firm*—Birch, Stewart, Kolasch & Birch, LLP

(57) ABSTRACT

Novel ester compounds having a sulfonamide structure are polymerizable into polymers having improved transparency at wavelength of up to 300 nm, especially ArF excimer laser light, and dry etching resistance. Resist compositions comprising the polymers are sensitive to high-energy radiation, have a high resolution, and lend themselves to micropatterning with electron beams or deep-UV rays.

9 Claims, No Drawings

POLYMERIZABLE ESTER HAVING SULFONAMIDE STRUCTURE, POLYMER, RESIST COMPOSITION AND PATTERNING PROCESS

This Non-provisional application claims priority under 35 U.S.C. 119(a) on Patent Application No(s). 2003-167524 filed in Japan on Jun. 12, 2003, the entire contents of which are hereby incorporated by reference.

This invention relates to (i) a novel polymerizable ester compound having a sulfonamide structure useful as a monomer for polymerization, (ii) a polymer obtained therefrom, (iii) a resist composition comprising the polymer as a base resin for use in the micropatterning technology, and (iv) a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using a KrF or ArF excimer laser as the light source is strongly desired to reach the practical level as the micropatterning technique capable of achieving a feature size of 0.3 μm or less.

The resist materials for use in photolithography using light of an excimer laser, especially ArF excimer laser having a wavelength of 193 nm, are, of course, required to have a high transparency to light of that wavelength. In addition, they are required to have an etching resistance sufficient to allow for film thickness reduction, a high sensitivity sufficient to eliminate any extra burden on the expensive optical material, and especially, a high resolution sufficient to form a precise micropattern. To meet these requirements, it is crucial to develop a base resin having a high transparency, rigidity and reactivity. None of the currently available polymers satisfy all of these requirements. Practically acceptable resist materials are not yet available.

Known high transparency resins include copolymers of acrylic or methacrylic acid derivatives (see JP-A 4-39665) and polymers containing in the backbone an alicyclic compound derived from a norbornene derivative (see JP-A 10-10739). All these resins are unsatisfactory. For example, copolymers of acrylic or methacrylic acid derivatives are relatively easy to increase reactivity in that highly reactive monomers can be introduced and acid labile units can be increased as desired, but very difficult to increase rigidity because of their backbone structure. On the other hand, the polymers containing alicyclic compounds in the backbone have rigidity within the acceptable range, but are less reactive with acid than poly(meth)acrylate because of their backbone structure, and difficult to increase reactivity because of the low freedom of polymerization. Additionally, since the backbone is highly hydrophobic, these polymers are less adherent when applied to substrates. Therefore, certain resist compositions which are formulated using these polymers as the base resin fail to withstand etching although they have satisfactory sensitivity and resolution. Some other resist compositions are highly resistant to etching, but have low sensitivity and low resolution below the practically acceptable level.

Another serious problem associated with the resist material adapted for ArF excimer laser lithography is a loss of resolution by the pattern collapse of fine lines caused by swelling, i.e., a volume increase at the boundary between exposed and unexposed areas during development.

SUMMARY OF THE INVENTION

An object of the invention is to provide a novel monomer to form a polymer for use in the formulation of a resist composition which is improved in all of adhesion, transparency, etching resistance and resolution (due to minimized swell) when processed by photolithography using light with a wavelength of up to 300 nm, especially ArF excimer laser light as the light source. Another object of the invention is to provide a polymer obtained from the monomer, a resist composition comprising the polymer, and a resist patterning process.

We have found that a polymer comprising recurring units derived from a polymerizable ester compound having a sulfonamide structure represented by the formula (1), (1'), (2) or (3) below has high transparency, especially at the exposure wavelength of an excimer laser, and high dry etching resistance, and that a resist composition comprising the polymer as a base resin is sensitive to high-energy radiation, good in resolution, and effective in micropatterning by electron beam or deep UV lithography. Since the pattern collapse by swelling during development is minimized, a precise micropattern can be easily formed. The composition is thus best suited as a micropatterning material for the VLSI manufacture.

Accordingly, the present invention provides an ester compound, a polymer, a resist composition, and a patterning process, defined below.

[1] A polymerizable ester compound having the general formula (1) or (1'):

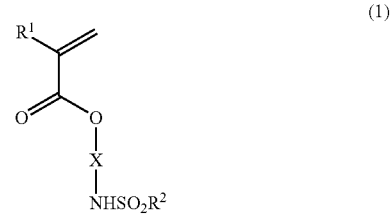

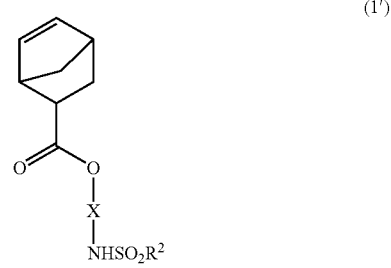

wherein $R^1$ is hydrogen, methyl or trifluoromethyl, $R^2$ is a straight, branched or cyclic alkyl group of 1 to 10 carbon atoms in which some or all of the hydrogen atoms may be substituted with halogen atoms, and X is a divalent saturated hydrocarbon group having an alicyclic structure.

[2] A polymerizable ester compound having the general formula (2):

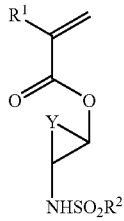

(2)

wherein $R^1$ is hydrogen, methyl or trifluoromethyl, $R^2$ is a straight, branched or cyclic alkyl group of 1 to 10 carbon atoms in which some or all of the hydrogen atoms may be substituted with halogen atoms, and Y is a divalent saturated hydrocarbon group which bonds at opposite ends with the ethylene moiety to form an alicyclic structure.

[3] A polymerizable ester compound having the general formula (3):

(3)

wherein $R^1$ is hydrogen, methyl or trifluoromethyl, $R^2$ is a straight, branched or cyclic alkyl group of 1 to 10 carbon atoms in which some or all of the hydrogen atoms may be substituted with halogen atoms, and Z is cyclohexanediyl or decahydronaphthalenediyl.

[4] A polymer comprising recurring units of the following general formula (1a), (2a), (3a) or (1a') and having a weight average molecular weight of 2,000 to 100,000.

(1a)

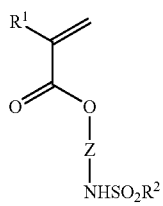

(2a)

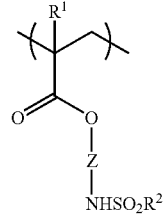

(3a)

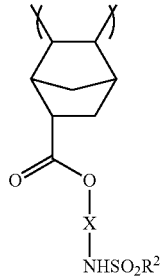

(1a')

Herein $R^1$ is hydrogen, methyl or trifluoromethyl, $R^2$ is a straight, branched or cyclic alkyl group of 1 to 10 carbon atoms in which some or all of the hydrogen atoms may be substituted with halogen atoms, X is a divalent saturated hydrocarbon group having an alicyclic structure, Y is a divalent saturated hydrocarbon group which bonds at opposite ends with the ethylene moiety to form an alicyclic structure, and Z is cyclohexanediyl or decahydronaphthalenediyl.

[5] The polymer of [4], further comprising recurring units of at least one type having the general formula (4a):

(4a)

wherein $R^1$ is hydrogen, methyl or trifluoromethyl, and $R^3$ is a tertiary alkyl group of 4 to 20 carbon atoms which may contain a hydroxyl, carbonyl, ester or ether group.

[6] The polymer of [5], further comprising recurring units of at least one type having the general formula (5a):

(5a)

wherein $R^1$ is hydrogen, methyl or trifluoromethyl, and $R^4$ is an alkyl group of 2 to 20 carbon atoms which contains a hydroxyl, carbonyl, ester, ether or cyano group.

[7] The polymer of any one of [4] to [6], wherein the recurring units of formula (1a), (2a) or (3a) are present in a molar fraction of at least 5%.

[8] A resist composition comprising the polymer of any one of [4] to [7].

[9] A resist composition comprising (A) the polymer of any one of [4] to [7], (B) a photoacid generator, and (C) an organic solvent.

[10] A resist composition comprising (A) the polymer of any one of [4] to [7], (B) a photoacid generator, (C) an organic solvent, and (D) a basic compound.

[11] A process for forming a resist pattern comprising the steps of (i) applying the resist composition of any one of [8] to [10] onto a substrate to form a coating, (ii) heat treating the coating and then exposing it to high-energy radiation having a wavelength of up to 300 nm or electron beams through a photomask, and (iii) heat treating the exposed coating and developing it with a liquid developer.

DESCRIPTION OF THE PREFERRED EMBODIMENT

The first embodiment of the invention is directed to a polymerizable ester compound having the general formula (1) or (1').

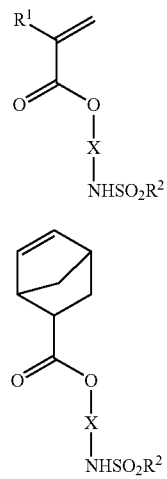

Herein $R^1$ is hydrogen, methyl or trifluoromethyl, $R^2$ is a straight, branched or cyclic $C_1$-$C_{10}$ alkyl group in which some or all of the hydrogen atoms may be substituted with halogen atoms, and X is a divalent saturated hydrocarbon group having an alicyclic structure.

In formula (1), $R^1$ is hydrogen, methyl or trifluoromethyl. In the event $R^1$=trifluoromethyl, the corresponding polymer has a high transparency at the wavelength of 157 nm as well and is thus applicable to the $F_2$ excimer laser resist.

In formulae (1) and (1'), $R^2$ is a straight, branched or cyclic $C_1$-$C_{10}$ alkyl group in which some or all of the hydrogen atoms may be substituted with halogen atoms. Examples of suitable alkyl groups represented by $R^2$ include methyl, ethyl, propyl, 2-propyl, butyl, 2-butyl, isobutyl, t-butyl, pentyl, hexyl, cyclohexyl, decyl, trichloromethyl, trifluoromethyl, pentafluoroethyl, nonafluorobutyl and heptadecafluorooctyl. A proper choice of $R^2$ in accordance with a particular application enables to optimize the acidity of sulfonamide group and eventually to adjust the characteristics of a photoresist composition utilizing the instant compound.

X is a divalent saturated hydrocarbon group having an alicyclic structure. Illustrative, non-limiting examples include cyclopentanediyl, cyclohexanediyl, cycloheptanediyl, bicycloheptanediyl, bicyclooctanediyl, dicyclodecanediyl, tricyclodecanediyl, adamantanediyl, tetracyclododecanediyl, methylcyclopentanediyl, methylcyclohexanediyl, methylcycloheptanediyl, methylbicycloheptanediyl, methylbicyclooctanediyl, methyldicyclodecanediyl, methyltricyclodecanediyl, methyladamantanediyl, and methyltetracyclododecanediyl.

Specifically, the ester compounds of formula (1) include, but are not limited to, compounds of the structure corresponding to the general formulae (2) and (3) to be described later, as well as the compounds shown just below.

In the formulae, Me is methyl and Et is ethyl.

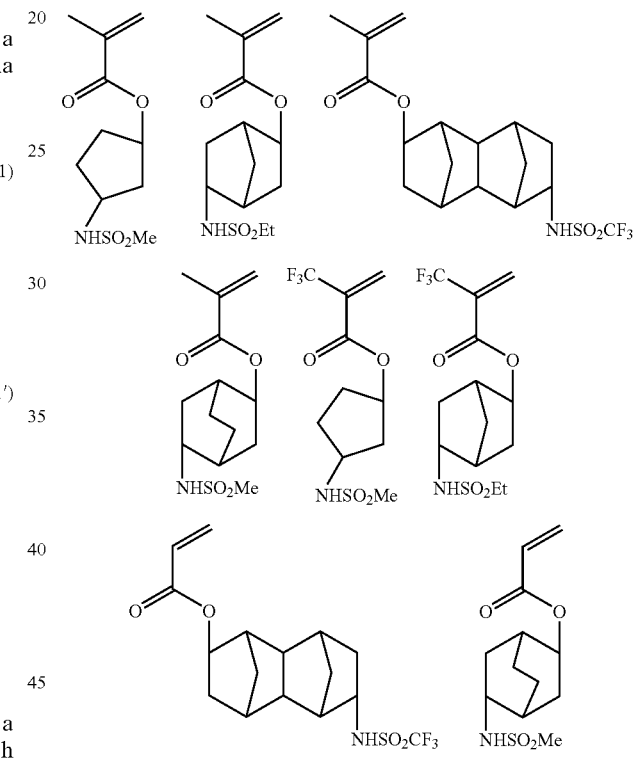

Illustrative, non-limiting examples of the compounds of formula (1') are given below.

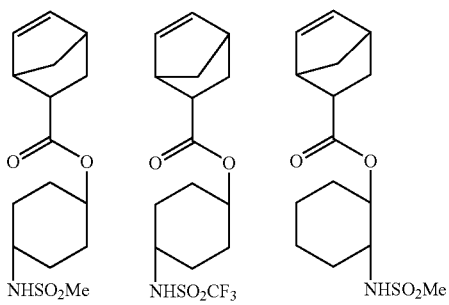

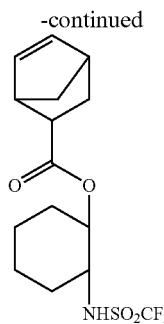

Preferably, the ester compounds of formula (1) are of the structure having the general formula (2).

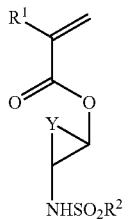

Herein $R^1$ is hydrogen, methyl or trifluoromethyl; $R^2$ is a straight, branched or cyclic $C_1$-$C_{10}$ alkyl group in which some or all of the hydrogen atoms may be substituted with halogen atoms; and Y is a divalent saturated hydrocarbon group which bonds at opposite ends with the ethylene moiety to form an alicyclic structure.

In formula (2), $R^1$ and $R^2$ are as defined or exemplified above. Y is a divalent saturated hydrocarbon group which bonds at opposite ends with the ethylene moiety to form an alicyclic structure. Illustrative, non-limiting examples of the alicyclic structure that Y forms with the ethylene moiety are given below.

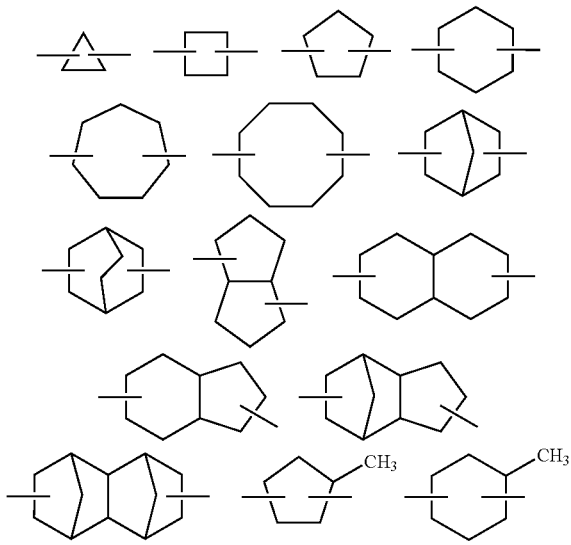

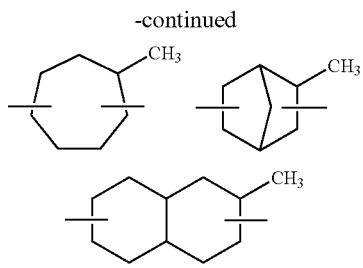

Illustrative, non-limiting examples of the ester compound of formula (2) are given below.

In the formulae, Bu is butyl and i-Pr is iso-propyl.

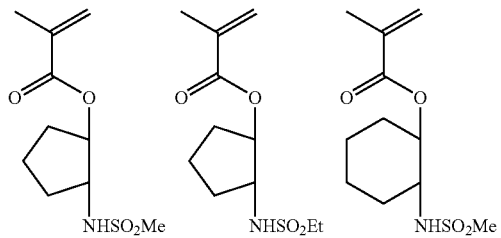

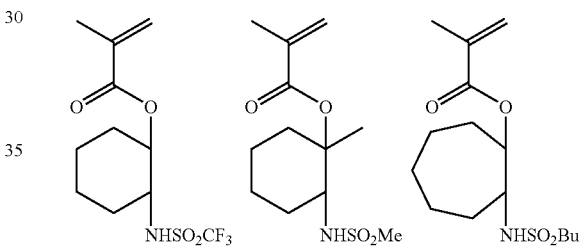

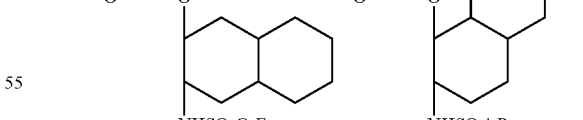

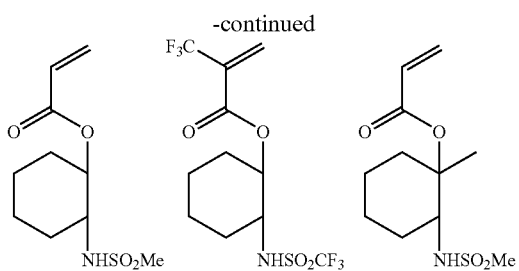

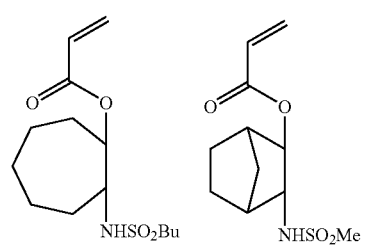

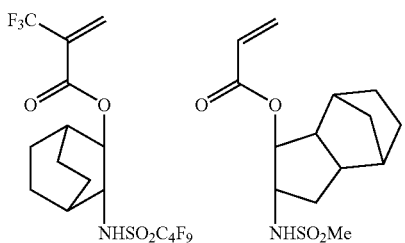

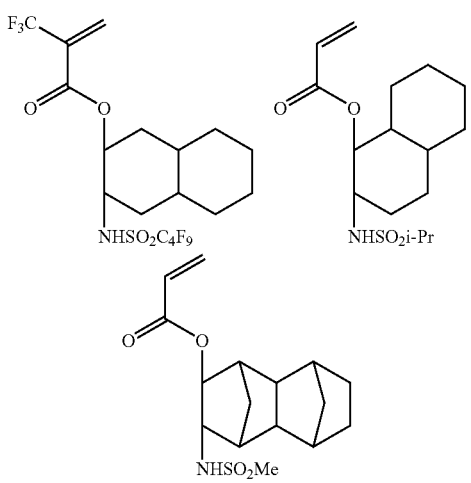

In preparing the ester compound of formula (2), for example, two synthesis methods described below may be used. The invention is not limited to these methods.

The first synthesis method involves two stages of reaction using an epoxide as the starting reactant. In the first stage of reaction, an epoxide of formula (6) is subjected to ring-opening reaction with a sulfonamide of formula (7) to form an alcohol compound of formula (8). The reaction is carried out by mixing the epoxide (6) with the sulfonamide (7) in a solvent, and optionally heating the mixture. An acidic or basic compound may be added as a catalyst for the reaction.

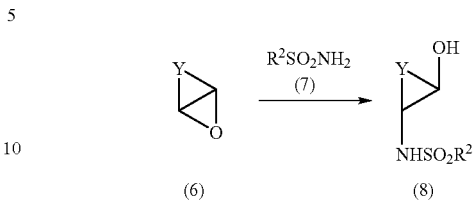

Herein $R^2$ and Y are as defined above.

The sulfonamide (7) is preferably used in an amount of 0.2 to 10 moles, especially 0.5 to 2 moles per mole of the epoxide (6). Examples of the solvent used herein include hydrocarbons such as toluene, hexane and heptane; ethers such as dibutyl ether, diethylene glycol diethyl ether, diethylene glycol dimethyl ether, and tetrahydrofuran; ketones such as acetone and 2-butanone; alcohols such as methanol, ethanol, 2-propanol, methoxyethanol, and diethylene glycol monomethyl ether; esters such as ethyl acetate; nitriles such as acetonitrile; amides such as N,N-dimethylformamide and N,N-dimethylacetamide; and water, which may be used alone or in admixture of any. Examples of the acidic compound which may be added as the catalyst include mineral acids such as hydrogen chloride, sulfuric acid, and phosphoric acid; organic sulfonic acids such as methanesulfonic acid and p-toluenesulfonic acid; carboxylic acids such as acetic acid, formic acid and trifluoroacetic acid; and Lewis acids such as boron trifluoride ether complex and zinc chloride, which may be used alone or in admixture of any. An appropriate amount of the acidic compound added is 0.001 to 1 mole, especially 0.01 to 0.1 mole per mole of the epoxide (6). Examples of the basic compound which may be added as the catalyst include metal hydroxides such as sodium hydroxide and potassium hydroxide; metal alkoxides such as sodium methoxide and potassium t-butoxide; metal hydrides such as sodium hydride; organometallic compounds such as butyl lithium and ethyl magnesium bromide; metal salts such as potassium carbonate and sodium carbonate; and organic basic compounds such as pyridine and triethylamine, which may be used alone or in admixture of any. An appropriate amount of the basic compound added is 0.001 to 5 moles, especially 0.01 to 2.0 moles per mole of the epoxide (6). For the above addition reaction, the temperature is preferably in a range from room temperature to near the boiling point of the solvent. An appropriate temperature may be selected from the range, depending on other reaction conditions. The time for the addition reaction is preferably determined by monitoring the progress of reaction by thin layer chromatography or gas chromatography. The reaction time is usually about 2 to about 100 hours. At the end of reaction, the target alcohol compound (8) is recovered by a conventional aqueous work-up step. If necessary, the compound (8) is purified by any conventional technique such as recrystallization, chromatography or distillation.

The second stage of reaction is esterification of the alcohol (8) as shown by the following scheme.

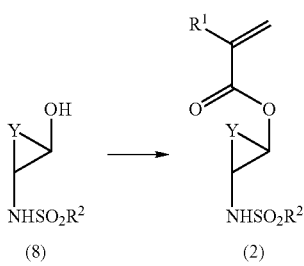

The esterification may be carried out by any conventional method, for example, a method using (meth)acrylic acid chloride or α-trifluoromethylacrylic acid chloride and a base, a dehydrating esterification method using (meth) acrylic acid or α-trifluoromethylacrylic acid and a dehydrating/condensing agent such as dicyclohexylcarbodiimide, a method using (meth)acrylic acid or α-trifluoromethylacrylic acid and an acid catalyst, and a transesterification method using a (meth)acrylic acid ester or α-trifluoromethylacrylic acid ester and an transesterification catalyst. If necessary, the ester compound (2) is purified by any conventional technique such as recrystallization, chromatography or distillation.

In the second synthesis method, an ester compound of formula (2) can be prepared through three stages of reaction as described below. In the first stage of reaction, an epoxide of formula (6) or halohydrin of formula (10) is reacted with ammonia to form an aminoalcohol compound of formula (9) as shown by the following scheme. The reaction is carried out by mixing the epoxide (6) or halohydrin (10) with ammonia in a solvent, and optionally heating the mixture. The starting reactant, epoxide (6) or halohydrin (10) can be customarily prepared from a corresponding cyclic olefin. An acidic or basic compound may be added as a catalyst for the reaction.

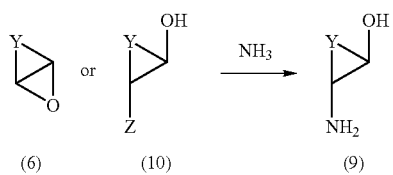

Herein Y is as defined above and Z is a halogen atom.

Ammonia is preferably used in an amount of 1 to 50 moles, especially 1 to 5 moles per mole of the epoxide (6) or halohydrin (10). Examples of the solvent used herein include hydrocarbons such as toluene, hexane and heptane; ethers such as dibutyl ether, diethylene glycol diethyl ether, diethylene glycol dimethyl ether, and tetrahydrofuran; ketones such as acetone and 2-butanone; alcohols such as methanol, ethanol, 2-propanol, methoxyethanol, and diethylene glycol monomethyl ether; esters such as ethyl acetate; nitriles such as acetonitrile; amides such as N,N-dimethylformamide and N,N-dimethylacetamide; and water, which may be used alone or in admixture of any. Inter alia, the alcohols are preferred. Examples of the acidic compound which may be added as the catalyst include mineral acids such as hydrogen chloride, sulfuric acid, and phosphoric acid; organic sulfonic acids such as methanesulfonic acid and p-toluenesulfonic acid; carboxylic acids such as acetic acid, formic acid and trifluoroacetic acid; and Lewis acids such as boron trifluoride ether complex and zinc chloride, which may be used alone or in admixture of any. An appropriate amount of the acidic compound added is 0.001 to 1 mole, especially 0.01 to 0.1 mole per mole of the epoxide (6) or halohydrin (10). Examples of the basic compound which may be added as the catalyst include metal hydroxides such as sodium hydroxide and potassium hydroxide; metal alkoxides such as sodium methoxide and potassium t-butoxide; metal hydrides such as sodium hydride; organometallic compounds such as butyl lithium and ethyl magnesium bromide; metal salts such as potassium carbonate and sodium carbonate; and organic basic compounds such as pyridine and triethylamine, which may be used alone or in admixture of any. An appropriate amount of the basic compound added is 0.001 to 5 moles, especially 0.01 to 1.5 moles per mole of the epoxide (6) or halohydrin (10). The above addition reaction is desirably carried out in a pressure vessel while optionally heating. The reaction temperature is preferably in a range from room temperature to about 300° C., more preferably 100 to 250° C. For the purpose of increasing the yield, the time for the addition reaction is preferably determined by monitoring the progress of reaction by thin layer chromatography or gas chromatography. The reaction time is usually about 1 to about 20 hours. At the end of reaction, the excess of ammonia and the solvent are distilled off, obtaining the target aminoalcohol compound (9). When a non-volatile catalyst is used, it is removed by an aqueous work-up step or adsorption treatment whereby the target compound (9) is obtained. If necessary, the compound (9) is purified by any conventional technique such as recrystallization, chromatography or distillation.

The second stage of reaction is a reaction to convert primary amine to sulfonyl as shown by the scheme below. This reaction may be carried out by ordinary techniques, for example, using a corresponding sulfonyl chloride and a base, whereby a sulfonamide compound of formula (8) is obtained. If necessary, the sulfonamide compound (8) is purified by any conventional technique such as recrystallization, chromatography or distillation.

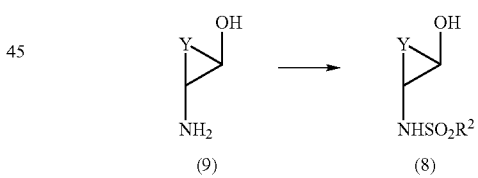

The third stage of reaction is the same as the second stage of the first synthesis method, and its description is omitted.

Also preferably, the ester compounds of formula (1) are of the structure having the general formula (3).

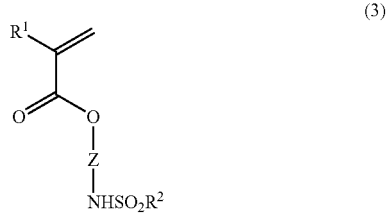

Herein $R^1$ is hydrogen, methyl or trifluoromethyl, $R^2$ is a straight, branched or cyclic $C_1$-$C_{10}$ alkyl group in which some or all of the hydrogen atoms may be substituted with halogen atoms, and Z is cyclohexanediyl or decahydronaphthalenediyl.

In formula (3), $R^1$ and $R^2$ are as defined or exemplified above. Z is cyclohexanediyl or decahydronaphthalenediyl.

Illustrative, non-limiting examples of the ester compound of formula (3) are given below.

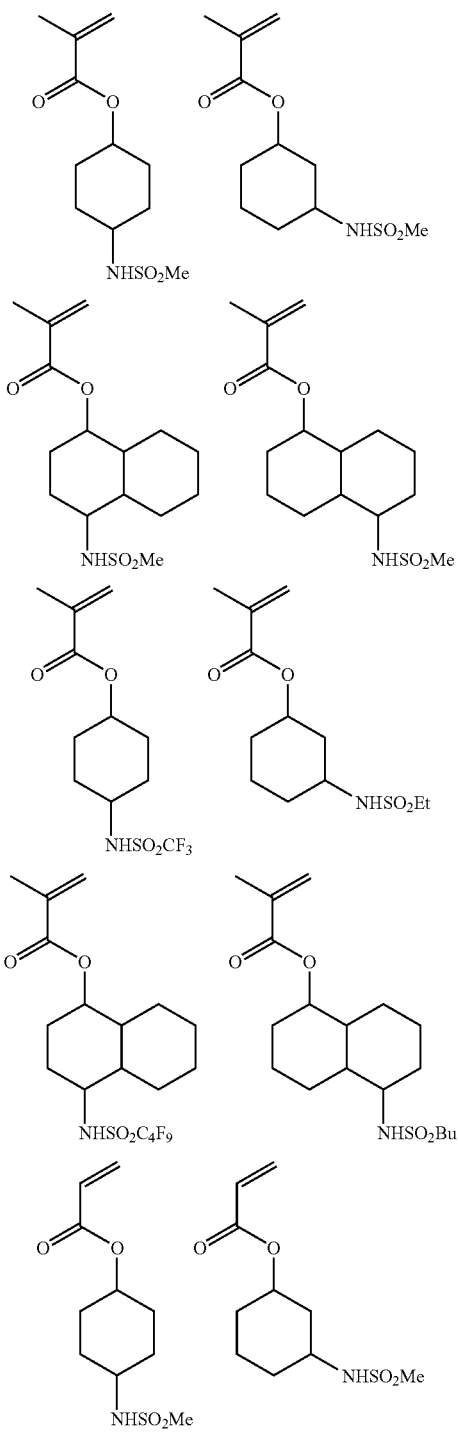

-continued

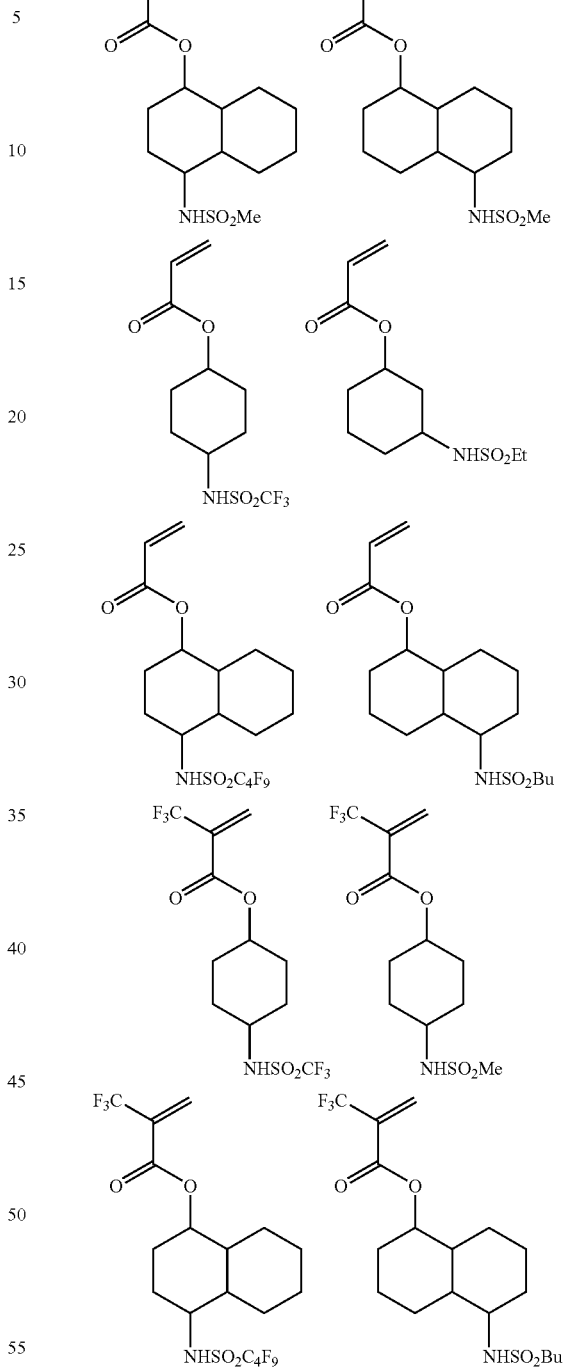

The ester compound of formula (3) can be prepared by the synthesis method described below although the invention is not limited to this method. The ester compound of formula (3) is synthesized through two stages of reaction, as shown by the scheme below, using a corresponding aminoalcohol compound as the starting reactant. The aminoalcohol compound used as the starting reactant can be prepared by reducing a corresponding aminophenol, aminonaphthol, nitrophenol or nitronaphthol in an ordinary way.

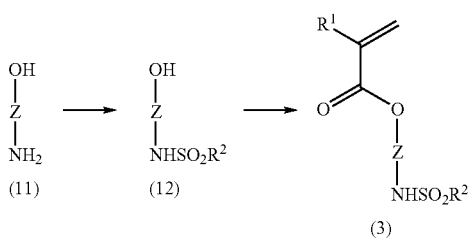

Herein R¹ is hydrogen or methyl, R² is a straight, branched or cyclic $C_1$-$C_{10}$ alkyl group in which some or all of the hydrogen atoms may be substituted with halogen atoms, and Z is cyclohexanediyl or decahydronaphthalenediyl.

The first stage of reaction is to convert the amine moiety of the aminoalcohol (11) to sulfonyl. This reaction can be carried out in the same way as the second stage in the second synthesis method of the ester compound of formula (2).

The second stage of reaction is to esterify the alcohol moiety of the alcohol (12). This reaction can be carried out in the same way as the second stage in the first synthesis method of the ester compound of formula (2).

In a further embodiment, the polymerizable ester compound of formula (1') can be synthesized, as shown by the scheme below, by Diels-Alder reaction of an acrylate ester (13) with cyclopentadiene, although the invention is not limited to this method. The acrylate ester (13) corresponds to the compound of formula (1) wherein R¹=H, and may be synthesized, for example, by the above-mentioned synthesis methods.

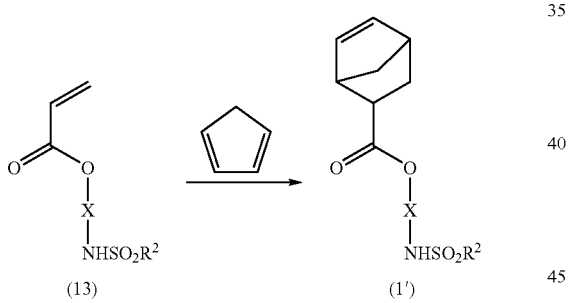

Cyclopentadiene is preferably used in an amount of 1 to 10 moles, especially 1 to 2 moles per mole of the acrylate ester (13). The reaction may be carried out in a solvent or in a solventless system. Examples of the solvent, if used, include hydrocarbons such as toluene, hexane and heptane; ethers such as dibutyl ether, diethylene glycol diethyl ether, diethylene glycol dimethyl ether, and tetrahydrofuran; ketones such as acetone and 2-butanone; alcohols such as methanol, ethanol, 2-propanol, methoxyethanol, and diethylene glycol monomethyl ether; esters such as ethyl acetate; nitriles such as acetonitrile; and amides such as N,N-dimethylformamide and N,N-dimethylacetamide, which may be used alone or in admixture of any. For the Diels-Alder reaction, a temperature of about –20° C. to 150° C., especially about 0° C. to 80° C. is preferred. For the purpose of increasing the yield, the time for the reaction is preferably determined by monitoring the progress of reaction by thin layer chromatography or gas chromatography. The reaction time is usually about 1 to about 50 hours. At the end of reaction, the excess of cyclopentadiene and the solvent are distilled off, yielding the target sulfonamide-bearing polymerizable ester compound (1'). If necessary, the compound (1') is purified by any conventional technique such as recrystallization, chromatography or distillation.

In the second aspect, the present invention provides a polymer or high molecular weight compound obtained using the ester compound of formula (1), (2), (3) or (1') as a monomer. Therefore, the polymer comprises recurring units of the general formula (1a), (2a), (3a) or (1a') and has a weight average molecular weight of 2,000 to 100,000.

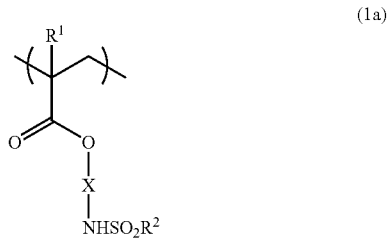

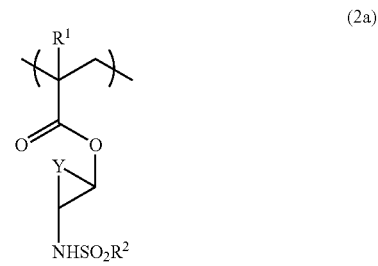

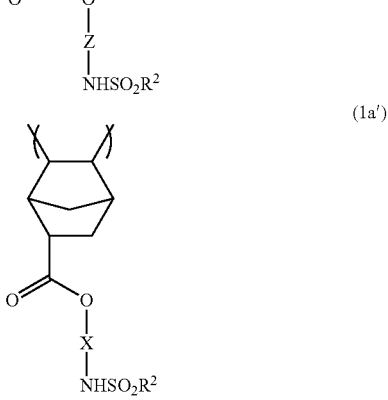

Herein R¹ is hydrogen, methyl or trifluoromethyl, R² is a straight, branched or cyclic $C_1$-$C_{10}$ alkyl group in which some or all of the hydrogen atoms may be substituted with halogen atoms, X is a divalent saturated hydrocarbon group having an alicyclic structure, Y is a divalent saturated hydrocarbon group which bonds at opposite ends with the ethylene moiety to form an alicyclic structure, and Z is cyclohexanediyl or decahydronaphthalenediyl.

In formulae (1a) (2a), (3a) and (1a'), R¹, R², X, Y and Z are as defined and exemplified above. In the inventive polymer, the recurring units of formula (1a), (2a), (3a) or (1a') should preferably be included in a molar fraction of at least 5%.

In a preferred embodiment, the polymer further includes recurring units of one or more types having the general formula (4a).

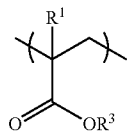

(4a)

Herein $R^1$ is hydrogen, methyl or trifluromethyl, and $R^3$ is a tertiary $C_4$-$C_{20}$ alkyl group which may contain a hydroxyl, carbonyl, ester or ether group.

In formula (4a), $R^1$ is a hydrogen atom or a methyl or trifluoromethyl group. $R^3$ is a tertiary alkyl group of 4 to 20 carbon atoms which may contain a hydroxyl, carbonyl, ester or ether group. Examples of the tertiary alkyl group represented by $R^3$ include, but are not limited to, t-butyl, t-pentyl, 1-ethyl-1-methylpropyl, triethylcarbinyl, 1-methylcyclopentyl, 1-ethylcyclopentyl, 1-cyclopentylcyclopentyl, 1-cyclohexylcyclopentyl, 1-(2-norbornyl)cyclopentyl, 1-(2-tetrahydrofuryl)cyclopentyl, 1-(7-oxa-2-norbornyl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-adamantyl-1-methylethyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl. Specifically, recurring units of formula (4a) are included in a sufficient amount to produce a polymer which is decomposed under the action of an acid to generate a carboxylic acid and turns alkali soluble.

In a more preferred embodiment, the polymer further includes recurring units of one or more types having the general formula (5a).

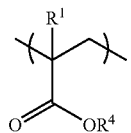

(5a)

Herein $R^1$ is hydrogen, methyl or trifluoromethyl, and $R^4$ is a $C_2$-$C_{20}$ alkyl group which contains a hydroxyl, carbonyl, ester, ether or cyano group.

In formula (5a), $R^1$ is a hydrogen atom or a methyl or trifluoromethyl group. $R^4$ is a $C_2$-$C_{20}$ alkyl group which contains a hydroxyl, carbonyl, ester, ether or cyano group. Examples of the alkyl group represented by $R^4$ include, but are not limited to, 2-hydroxyethyl, 2-cyanoethyl, 3-hydroxy-1-adamantyl, 3,5-dihydroxy-1-adamantyl, hydroxynorbornan-2-yl, 3-cyano-1-adamantyl, cyanonorbornan-2-yl, 2-oxo-3-tetrahydrofuranyl, 2-oxo-4-tetrahydrofuranyl, 4-oxa-5-oxotricyclo[5.2.1.0$^{2,6}$]decyl, 2,6-norbornanecarbolacton-3-ylmethyl, 2,6-norbornanecarbolacton-5-yl, 3-methoxycarbonyl-2,6-norbornanecarbolacton-5-yl, 7-oxa-2,6-norbornanecarbolacton-5-yl, 7-oxa-2,3-norbornanecarbolacton-5-yl, 7-oxa-2,3-norbornanecarbolacton-6-yl, spiro[norbornane-2,4'-(2-oxotetrahydrofuran)]-5-yl, and spiro[norbornane-2,4'-(2-oxotetrahydrofuran)]-6-yl. By controlling the type and amount of recurring units of formula (5a) introduced, the polymer is given an optimum balance of hydrophilic and hydrophobic properties.

In addition to the recurring units of formulae (1a), (2a), (3a), (1a'), (4a) and (5a), recurring units q originating from any of polymerizable compounds having a carbon-to-carbon double bond may be introduced into the inventive polymer for further improving the resist performance. Illustrative examples of such additional compounds are α,β-unsaturated carboxylic acids such as (meth)acrylic acid and α-trifluoromethylacrylic acid, α,β-unsaturated carboxylic esters such as (meth)acrylates, crotonates, maleates, and α-trifluoromethylacrylic acid esters, α,β-unsaturated nitriles such as acrylonitrile, α,β-unsaturated lactones such as 5,6-dihydro-2H-pyran-2-one, maleic anhydride, itaconic anhydride, maleimides, norbornene derivatives, tetracyclo[4.4.0.1$^{2,5}$.1$^{7,10}$]dodecene derivatives, allyl ethers, vinyl ethers, vinyl esters, and vinyl silanes.

The polymer of the invention can be prepared by polymerizing the polymerizable ester compound of formula (1), (1'), (2) or (3) and optional polymerizable compounds (to form the above-described additional units) by any conventional technique such as radical, anionic and cationic polymerization techniques.

Provided that m stands for recurring units of formula (1a), (2a), (3a) or (1a'), n stands for recurring units of formula (4a), p stands for recurring units of formula (5a), and q stands for recurring units derived from a polymerizable carbon-to-carbon double bond-bearing compound, these parameters should preferably satisfy:

$0.05 \leq m/(m+n+p+q) \leq 0.8$, especially $0.1 \leq m/(m+n+p+q) \leq 0.5$, $0.05 \leq n/(m+n+p+q) \leq 0.8$, especially $0.15 \leq n/(m+n+p+q) \leq 0.7$, $0.05 \leq p/(m+n+p+q) \leq 0.8$, especially $0.15 \leq p/(m+n+p+q) \leq 0.7$, and $0 \leq q/(m+n+p+q) \leq 0.8$, especially $0 \leq q/(m+n+p+q) \leq 0.5$.

The polymer of the invention should preferably have a weight average molecular weight (Mw) of about 2,000 to about 100,000. With a Mw of less than 2,000, film formation and resolution may be poor whereas a Mw of more than 100,000 can compromise resolution.

Resist Composition

Advantageously, the polymer of the invention is used as a base resin in a resist composition, typically a positive resist composition, especially a chemically amplified positive resist composition. Therefore, the present invention in the third aspect provides a resist composition comprising the above-described polymer. The resist composition is typically comprised of (A) the above-described polymer as a base resin, (B) a photoacid generator, (C) an organic solvent, and optionally (D) a basic compound.

Component B

The photoacid generator (B) may be any compound capable of generating an acid upon exposure to high energy radiation having a wavelength of up to 300 nm or electron beams as long as a resist composition comprising the photoacid generator, the inventive polymer and an organic solvent can be a homogeneous solution which is effectively applicable to form a uniform film.

Examples of the photoacid generator which can be used herein include:
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives,
(ix) sulfonate derivatives, and
(x) oxime sulfonates.

These photoacid generators are described in detail.

(i) Onium Salts of Formula (P1a-1), (P1a-2) or (P1b):

(P1a-1)

(P1a-2)

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

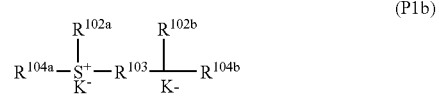

(P1b)

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2)

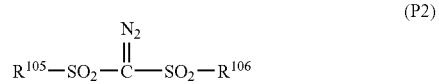

(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

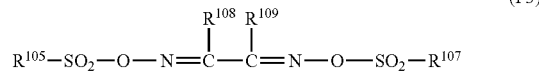

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

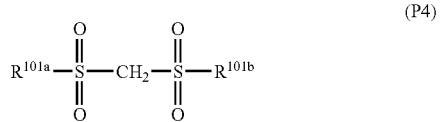

Herein, $R^{101a}$ and $R^{101b}$ are as defined above.

(v) Sulfonic Acid Esters of N-hydroxyimide Compounds of Formula (P5)

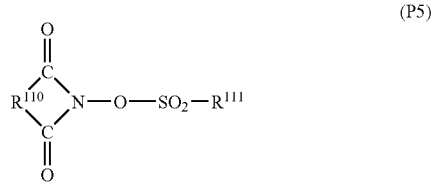

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; and the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the photoacid generator include: onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;

glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
  bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
  β-ketosulfone derivatives such as
2-cyclohexylcarbonyl-2-(p-toluenesulfonyl)propane and
2-isopropylcarbonyl-2-(p-toluenesulfonyl)propane;
  nitrobenzyl sulfonate derivatives such as
2,6-dinitrobenzyl p-toluenesulfonate and
2,4-dinitrobenzyl p-toluenesulfonate;
  sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
  sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these photoacid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate, triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

Also included are the oxime sulfonates described in U.S. Pat. No. 6,004,724, for example,
(5-(4-toluenesulfonyl)oxyimino-5H-thiophen-2-ylidene)phenylacetonitrile,
(5-(10-camphorsulfonyl)oxyimino-5H-thiophen-2-ylidene)phenylacetonitrile,
(5-n-octanesulfonyloxyimino-5H-thiophen-2-ylidene)phenylacetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example,
2,2,2-trifluoro-1-phenyl-ethanone oxime-O-methylsulfonate;
2,2,2-trifluoro-1-phenyl-ethanone oxime-O-(10-camphorylsulfonate);

2,2,2-trifluoro-1-phenyl-ethanone oxime-O-(4-methoxyphenylsulfonate);
2,2,2-trifluoro-1-phenyl-ethanone oxime-O-(1-naphthylsulfonate);
2,2,2-trifluoro-1-phenyl-ethanone oxime-O-(2-naphthylsulfonate);
2,2,2-trifluoro-1-phenyl-ethanone oxime-O-(2,4,6-trimethylphenylsulfonate);
2,2,2-trifluoro-1-(4-methylphenyl)-ethanone oxime-O-(10-camphorylsulfonate);
2,2,2-trifluoro-1-(4-methylphenyl)-ethanone oxime-O-(methylsulfonate);
2,2,2-trifluoro-1-(2-methylphenyl)-ethanone oxime-O-(10-camphorylsulfonate);
2,2,2-trifluoro-1-(2,4-dimethylphenyl)-ethanone oxime-O-(10-camphorylsulfonate);
2,2,2-trifluoro-1-(2,4-dimethylphenyl)-ethanone oxime-O-(1-naphthylsulfonate);
2,2,2-trifluoro-1-(2,4-dimethylphenyl)-ethanone oxime-O-(2-naphthylsulfonate);
2,2,2-trifluoro-1-(2,4,6-trimethylphenyl)-ethanone oxime-O-(10-camphorylsulfonate);
2,2,2-trifluoro-1-(2,4,6-trimethylphenyl)-ethanone oxime-O-(1-naphthylsulfonate);
2,2,2-trifluoro-1-(2,4,6-trimethylphenyl)-ethanone oxime-O-(2-naphthylsulfonate);
2,2,2-trifluoro-1-(4-methoxyphenyl)-ethanone oxime-O-methylsulfonate;
2,2,2-trifluoro-1-(4-methylthiophenyl)-ethanone oxime-O-methylsulfonate;
2,2,2-trifluoro-1-(3,4-dimethoxyphenyl)-ethanone oxime-O-methylsulfonate;
2,2,3,3,4,4,4-heptafluoro-1-phenyl-butanone oxime-O-(10-camphorylsulfonate);
2,2,2-trifluoro-1-(phenyl)-ethanone oxime-O-methylsulfonate;
2,2,2-trifluoro-1-(phenyl)-ethanone oxime-O-10-camphorylsulfonate;
2,2,2-trifluoro-1-(phenyl)-ethanone oxime-O-(4-methoxyphenyl)sulfonate;
2,2,2-trifluoro-1-(phenyl)-ethanone oxime-O-(1-naphthyl)sulfonate;
2,2,2-trifluoro-1-(phenyl)-ethanone oxime-O-(2-naphthyl)sulfonate;
2,2,2-trifluoro-1-(phenyl)-ethanone oxime-O-(2,4,6-trimethylphenyl)sulfonate;
2,2,2-trifluoro-1-(4-methylphenyl)-ethanone oxime-O-(10-camphoryl)sulfonate;
2,2,2-trifluoro-1-(4-methylphenyl)-ethanone oxime-O-methylsulfonate;
2,2,2-trifluoro-1-(2-methylphenyl)-ethanone oxime-O-(10-camphoryl)sulfonate;
2,2,2-trifluoro-1-(2,4-dimethylphenyl)-ethanone oxime-O-(1-naphthyl)sulfonate;
2,2,2-trifluoro-1-(2,4-dimethylphenyl)-ethanone oxime-O-(2-naphthyl)sulfonate;
2,2,2-trifluoro-1-(2,4,6-trimethylphenyl)-ethanone oxime-O-(10-camphoryl)sulfonate;
2,2,2-trifluoro-1-(2,4,6-trimethylphenyl)-ethanone oxime-O-(1-naphthyl)sulfonate;
2,2,2-trifluoro-1-(2,4,6-trimethylphenyl)-ethanone oxime-O-(2-naphthyl)sulfonate;
2,2,2-trifluoro-1-(4-methoxyphenyl)-ethanone oxime-O-methylsulfonate;
2,2,2-trifluoro-1-(4-thiomethylphenyl)-ethanone oxime-O-methylsulfonate;
2,2,2-trifluoro-1-(3,4-dimethoxyphenyl)-ethanone oxime-O-methylsulfonate;
2,2,2-trifluoro-1-(4-methoxyphenyl)-ethanone oxime-O-(4-methylphenyl)sulfonate;
2,2,2-trifluoro-1-(4-methoxyphenyl)-ethanone oxime-O-(4-methoxyphenyl)sulfonate;
2,2,2-trifluoro-1-(4-methoxyphenyl)-ethanone oxime-O-(4-dodecylphenyl)sulfonate;
2,2,2-trifluoro-1-(4-methoxyphenyl)-ethanone oxime-O-octylsulfonate;
2,2,2-trifluoro-1-(4-thiomethylphenyl)-ethanone oxime-O-(4-methoxyphenyl)sulfonate;
2,2,2-trifluoro-1-(4-thiomethylphenyl)-ethanone oxime-O-(4-dodecylphenyl)sulfonate;
2,2,2-trifluoro-1-(4-thiomethylphenyl)-ethanone oxime-O-octylsulfonate;
2,2,2-trifluoro-1-(4-thiomethylphenyl)-ethanone oxime-O-(2-naphthyl)sulfonate;
2,2,2-trifluoro-1-(2-methylphenyl)-ethanone oxime-O-methylsulfonate;
2,2,2-trifluoro-1-(4-methylphenyl)ethanone oxime-O-phenylsulfonate;
2,2,2-trifluoro-1-(4-chlorophenyl)-ethanone oxime-O-phenylsulfonate;
2,2,3,3,4,4,4-heptafluoro-1-(phenyl)-butanone oxime-O-(10-camphoryl)sulfonate;
2,2,2-trifluoro-1-naphthyl-ethanone oxime-O-methylsulfonate;
2,2,2-trifluoro-2-naphthyl-ethanone oxime-O-methylsulfonate;
2,2,2-trifluoro-1-[4-benzylphenyl]-ethanone oxime-O-methylsulfonate;
2,2,2-trifluoro-1-[4-(phenyl-1,4-dioxa-but-1-yl)phenyl]-ethanone oxime-O-methylsulfonate;
2,2,2-trifluoro-1-naphthyl-ethanone oxime-O-propylsulfonate;
2,2,2-trifluoro-2-naphthyl-ethanone oxime-O-propylsulfonate;
2,2,2-trifluoro-1-[4-benzylphenyl]-ethanone oxime-O-propylsulfonate;
2,2,2-trifluoro-1-[4-methylsulfonylphenyl]-ethanone oxime-O-propylsulfonate;
1,3-bis[1-(4-phenoxyphenyl)-2,2,2-trifluoroethanone oxime-O-sulfonyl]phenyl;
2,2,2-trifluoro-1-[4-methylsulfonyloxyphenyl]-ethanone oxime-O-propylsulfonate;
2,2,2-trifluoro-1-[4-methylcarbonyloxyphenyl]-ethanone oxime-O-propylsulfonate;
2,2,2-trifluoro-1-[6H,7H-5,8-dioxonaphth-2-yl]-ethanone oxime-O-propylsulfonate;
2,2,2-trifluoro-1-[4-methoxycarbonylmethoxyphenyl]-ethanone oxime-O-propylsulfonate;
2,2,2-trifluoro-1-[4-(methoxycarbonyl)-(4-amino-1-oxapent-1-yl)-phenyl]-ethanone oxime-O-propylsulfonate;
2,2,2-trifluoro-1-[3,5-dimethyl-4-ethoxyphenyl]-ethanone oxime-O-propylsulfonate;
2,2,2-trifluoro-1-[4-benzyloxyphenyl]-ethanone oxime-O-propylsulfonate;
2,2,2-trifluoro-1-[2-thiophenyl]-ethanone oxime-O-propylsulfonate; and
2,2,2-trifluoro-1-[1-dioxa-thiophen-2-yl)]-ethanone oxime-O-propylsulfonate.

Also included are the oxime sulfonates described in JP-A 9-95479 and JP-A 9-230588 and the references cited therein, for example,
α-(p-toluenesulfonyloxyimino)-phenylacetonitrile,
α-(p-chlorobenzenesulfonyloxyimino)-phenylacetonitrile, α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylenediacetonitrile, etc.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.1 to 50 parts, and especially 0.5 to 40 parts by weight, per 100 parts by weight of the base resin (all parts are by weight, hereinafter). Less than 0.1 part of the photoacid generator may generate a less amount of acid upon exposure, sometimes leading to a poor sensitivity and resolution whereas more than 50 parts of the photoacid generator may adversely affect the transmittance and resolution of resist.

Component C

The organic solvent (C) used herein may be any organic solvent in which the base resin, photoacid generator, and other components are soluble. Illustrative, non-limiting, examples of the organic solvent include ketones such as cyclohexanone and methyl isopentyl ketone; alcohols such as 3-methoxybutanol, 3-methyl-3-methoxybutanol, 1-methoxy-2-propanol, and 1-ethoxy-2-propanol; ethers such as propylene glycol monomethyl ether,
ethylene glycol monomethyl ether,
propylene glycol monoethyl ether,
ethylene glycol monoethyl ether,
propylene glycol dimethyl ether, and
diethylene glycol dimethyl ether; esters such as
propylene glycol monomethyl ether acetate,
propylene glycol monoethyl ether acetate, ethyl lactate,
ethyl pyruvate, butyl acetate, methyl 3-methoxypropionate,
ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether and 1-ethoxy-2-propanol in which the photoacid generator is most soluble, propylene glycol monomethyl ether acetate, cyclohexanone, or a mixture thereof.

An appropriate amount of the organic solvent used is about 200 to 1,000 parts, especially about 400 to 800 parts by weight per 100 parts by weight of the base resin.

Component D

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

The basic compound is preferably formulated in an amount of 0.001 to 2 parts, and especially 0.01 to 1 part by weight, per 100 parts by weight of the base resin. Less than 0.001 part of the basic compound achieves no or little addition effect whereas more than 2 parts would result in too low a sensitivity.

While the resist composition of the invention is basically composed of the inventive polymer, the photoacid generator, the organic solvent and the basic compound as described above, it may further include any well-known components such as dissolution inhibitors, acidic compounds, stabilizers, dyes, and surfactants, if necessary.

Pattern formation using the resist composition of the invention may be carried out by a known lithographic technique. For example, the resist composition is applied onto a substrate such as a silicon wafer by spin coating or the like to form a resist film having a thickness of 0.3 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV or excimer laser radiation having a wavelength of 248 to 157 nm, x-rays, or an electron beam. The desired pattern may not be obtainable outside the upper and lower limits of the above range.

EXAMPLE

Examples of the invention are given below by way of illustration and not by way of limitation. The meaning of abbreviations is IR for infrared spectroscopy, NMR for nuclear magnetic resonance, and GPC for gel permeation chromatography.

Example 1

Synthesis of 2-[(methylsulfonyl)amino]cyclohexyl methacrylate

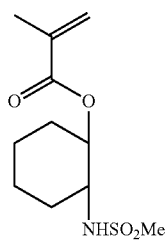

In a nitrogen atmosphere, a mixture of 108 g of 1,2-epoxycyclohexane, 95.1 g of methanesulfonamide, 11.2 g of t-butoxypotassium, and 1,000 g of tetrahydrofuran was heated under reflux for 100 hours. The reaction solution was neutralized with hydrochloric acid and then subjected to conventional aqueous work-up. Purification by column chromatography yielded an alcohol compound, 2-[(methylsulfonyl)amino]cyclohexanol. In a nitrogen atmosphere, the alcohol compound was combined with 111 g of triethylamine and 2,000 g of acetonitrile, to which 105 g of methacryloyl chloride was added dropwise at −20° C. The mixture was gradually warmed to room temperature and then stirred for 10 hours. The reaction mixture was subjected to conventional aqueous work-up and purified by column chromatography, obtaining 165 g of 2-[(methylsulfonyl)amino]-cyclohexyl methacrylate. The yield was 63% based on the methanesulfonamide.

IR & NMR Analysis

IR (KBr): ν=3311, 2962, 2949, 2937, 2871, 2860, 1699, 1632, 1470, 1456, 1441, 1417, 1387, 1321, 1284, 1173, 1155, 1146, 1084, 1016, 1004, 980, 946, 908, 843, 820, 761 cm$^{-1}$ $^1$H-NMR (270 MHz in CDCl$_3$): δ=1.20-1.55 (4H, m), 1.65-1.85 (2H, m), 1.93 (3H, br. s), 2.04 (1H, m), 2.18 (1H, m), 2.88 (3H, s), 3.37 (1H, m), 4.60-4.80 (2H, m), 5.60 (1H, m), 6.13 (1H, m)

Example 2

Synthesis of 2-[(methylsulfonyl)amino]cyclohexyl acrylate

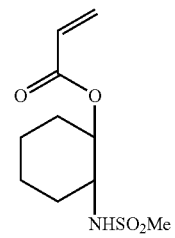

By following the same procedure as in Example 1 except that an equimolar amount of acryloyl chloride was used instead of the methacryloyl chloride, 2-[(methylsulfonyl)-amino]cyclohexyl acrylate was synthesized (yield 60%).

Example 3

Synthesis of 4-[(methylsulfonyl)amino]cyclohexyl methacrylate

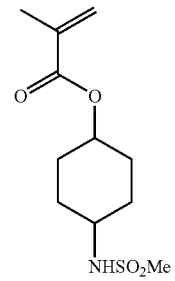

In a nitrogen atmosphere, 115 g of methanesulfonyl chloride was added dropwise to a mixture of 115 g of 4-aminocyclohexanol, 212 g of triethylamine and 1,000 g of N,N-dimethylformamide at −20° C. The mixture was stirred for one hour, after which 105 g of methacryloyl chloride was added dropwise at −20° C. The mixture was gradually warmed to room temperature and then stirred for 5 hours.

The reaction mixture was subjected to conventional aqueous work-up and purified by column chromatography, obtaining 196 g of 4-[(methylsulfonyl)amino]cyclohexyl methacrylate. The yield was 75% based on the 4-aminocyclohexanol.

IR & NMR Analysis

IR (KBr): ν=3302, 3266, 3023, 2948, 2865, 1720, 1633, 1448, 1336, 1319, 1311, 1294, 1186, 1155, 1085, 1024, 987, 939, 902, 817, 763 cm$^{-1}$ $^1$H-NMR (600 MHz in CDCl$_3$): δ=1.43 (2H, m), 1.52 (2H, m), 1.91 (3H, m), 2.02 (2H, m), 2.08 (2H, m), 2.97 (3H, s), 3.35 (1H, m), 4.70-4.77 (2H, m), 5.53 (1H, m), 6.06 (1H, m)

Example 4

Synthesis of 4-[(methylsulfonyl)amino]cyclohexyl acrylate

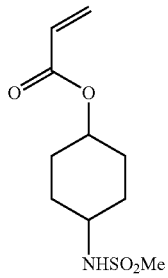

By following the same procedure as in Example 3 except that an equimolar amount of acryloyl chloride was used instead of the methacryloyl chloride, 4-[(methylsulfonyl)-amino]cyclohexyl acrylate was synthesized (yield 71%).

Example 5

Synthesis of 4-[(trifluoromethylsulfonyl)amino]cyclohexyl α-trifluoromethylacrylate

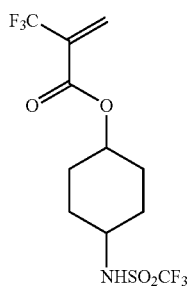

By following the same procedure as in Example 3 except that trifluoromethanesulfonic anhydride was used instead of the sulfonyl chloride and α-trifluoromethylacryloyl chloride was used instead of the methacryloyl chloride, both in equimolar amounts, 4-[(trifluoromethylsulfonyl)amino]-cyclohexyl α-trifluoromethylacrylate was synthesized (yield 60%).

Example 6

Synthesis of 4-[(methylsulfonyl)amino]cyclohexyl 5-norbornene-2-carboxylate

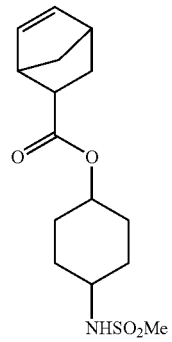

To a mixture of 26.1 g of 4-[(methylsulfonyl)-cyclohexyl acrylate (synthesized by the procedure of Example 4) and 50 g of toluene was added 8.0 g of cyclopentadiene. The mixture was stirred at 40° C. for 24 hours. The reaction solution was purified directly by silica gel column chromatography, obtaining 32.0 g of 4-[(methylsulfonyl)-amino]cyclohexyl 5-norbornene-2-carboxylate (yield 98%).

Example 7

Synthesis of 2-[(trifluoromethylsulfonyl)amino]cyclohexyl methacrylate

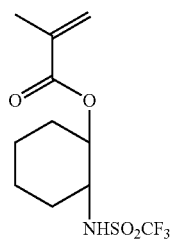

In a nitrogen atmosphere, to a mixture of 115 g of 2-aminocyclohexanol, 235 g of 2,6-lutidine, and 1,000 g of N,N-dimethylformamide was added 282 g of trifluoromethanesulfonic anhydride at −20° C. After agitation for one hour, 105 g of methacryloyl chloride was added thereto at −20° C. The mixture was gradually warmed to room temperature and then stirred for 5 hours. The reaction mixture was subjected to conventional aqueous work-up and purified by column chromatography, obtaining 221 g of 2-[(trifluoromethylsulfonyl)amino]cyclohexyl methacrylate as a colorless solid. The yield was 70%.

IR & NMR Analysis

IR (KBr): ν=3239 (br.), 2944, 2867, 1700, 1637, 1454, 1382, 1319, 1295, 1232, 1189, 1153, 1118, 1081, 1060, 1012, 964, 937, 611 cm$^{-1}$ $^1$H-NMR (600 MHz in CDCl$_3$, main isomer): δ=1.40-1.55 (3H, m), 1.59 (1H, m), 1.70-1.90 (3H, m), 1.95-2.05 (4H, m), 3.72 (1H, m), 5.10 (1H, ddd, J=5, 5, 2.8, 2.8 Hz), 5.39 (1H, br. d, J=8.9 Hz), 5.63 (1H, m), 6.14 (1H, br. s).

Example 8

Synthesis of 4-[(trifluoromethylsulfonyl)amino]cyclohexyl methacrylate

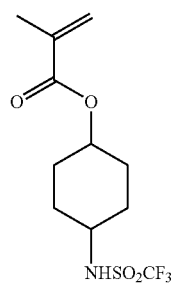

By following the same procedure as in Example 7 except that 4-aminocyclohexanol was used instead of 2-aminocyclohexanol, 4-[(trifluoromethylsulfonyl)amino]-cyclohexyl methacrylate was synthesized as a colorless solid (yield 64%).

IR & NMR Analysis

IR (KBr): ν=3249 (br.), 2950, 2873, 1710, 1633, 1456, 1396, 1376, 1338, 1307, 1295, 1228, 1213, 1186, 1149, 1122, 1076, 1004, 971, 962, 948, 781, 734, 605 cm$^{-1}$ $^1$H-NMR (600 MHz in CDCl$_3$): δ=1.37 (2H, dddd, J=12.7, 12.7, 11.0 Hz), 1.66 (1H, br. s), 1.90-2.10 (9H, m), 3.59 (1H, tt, J=11.0, 4.3 Hz), 3.82 (1H, tt, J=11.5, 4.3 Hz), 5.64 (1H, br. s), 5.69 (1H, q, J=1.5 Hz).

Example 9

Synthesis of 2-[(nonafluorobuthylsulfonyl)amino]cyclohexyl methacrylate

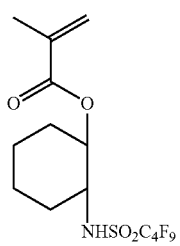

In a nitrogen atmosphere, to a mixture of 115 g of 2-aminocyclohexanol, 222 g of triethylamine, and 2,000 g of tetrahydrofuran was added 302 g of nonafluorobutanesulfonyl fluoride at 0° C. The mixture was gradually warmed to room temperature and then stirred for 10 hours. After cooling the mixture to 0° C., 105 g of methacryloyl chloride was added thereto. The resulting mixture was gradually warmed to room temperature and then stirred for 5 hours. The reaction mixture was subjected to conventional aqueous work-up and purified by column chromatography, obtaining 2-[(nonafluorobuthylsulfonyl)amino]cyclohexyl methacrylate (yield 65%).

Example 10

Synthesis of 4-[(nonafluorobuthylsulfonyl)amino]cyclohexyl methacrylate

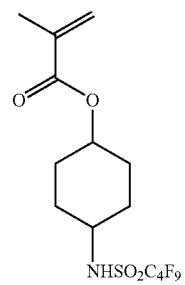

By following the same procedure as in Example 9 except that 4-aminocyclohexanol was used instead of 2-aminocyclohexanol, 4-[(nonafluorobuthylsulfonyl)amino]cyclohexyl methacrylate was synthesized (yield 60%).

Example 11

Synthesis of a polymer having the structural formula (14) wherein x=0.25, y=0.40, z=0.35

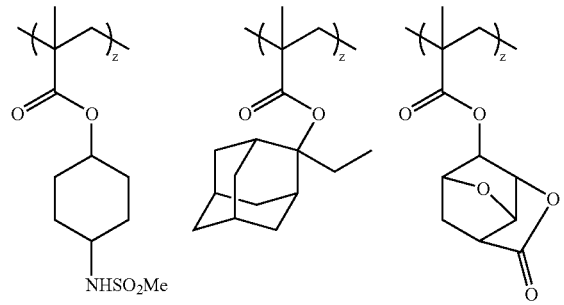

(14)

In a nitrogen atmosphere, a mixture of 6.1 g of the methacrylate obtained in Example 3, 8.5 g of 2-ethyl-2-adamantyl methacrylate, 9.7 g of 7-oxanorbornane-2,6-carbolacton-5-yl methacrylate, 60 mg of N,N'-azobisisobutyronitrile, and 80 ml of tetrahydrofuran was heated and stirred at 60° C. for 20 hours. After cooling, the reaction mixture was added dropwise to 2 liters of methanol under vigorous stirring. The precipitate which settled down was collected by filtration. The solids were washed with methanol and dried in vacuum, obtaining 19.5 g of the target polymer. The yield was 80%. An integration ratio calculated from its $^1$H-NMR spectrum indicated a copolymerization ratio of approximately 25:40:35. GPC analysis using polystyrene standards indicated a weight average molecular weight (Mw) of 9,800 and a polydispersity index (Mw/Mn) of 1.80.

Example 12

Resist Pattern Formation Using Polymer

Using the polymer obtained in Example 11, a resist material was prepared according to the following formulation.
(A) 80 parts by weight of the polymer of Example 7 as a base polymer,
(B) 1.0 part by weight of triphenylsulfonium trifluoromethanesulfonate as a photoacid generator,
(C) 480 parts by weight of propylene glycol monomethyl ether acetate as a solvent, and
(D) 0.08 part by weight of triethanolamine as a basic compound.

This was passed through a Teflon® filter having a pore diameter of 0.2 μm. The resist solution was spin coated on a silicon wafer having hexamethyldisilazane sprayed thereon at 90° C. for 40 seconds and heat treated at 110° C. for 90 seconds, forming a resist film of 500 nm thick. The resist film was exposed to ArF excimer laser light, heat treated at 110° C. for 90 seconds, cooled down to 23° C., and dipped in a 2.38% tetramethylammonium hydroxide aqueous solution at 23° C. for 60 seconds for development, thereby forming a 1:1 line-and-space pattern. The wafer as developed was observed under top-down SEM. Patterns down to a line width of 0.10 μm were left unstrapped and hence, resolved. This demonstrates that the photoresist material of the invention has improved substrate adhesion and resolution.

Example 13

Transparency of Polymer

The polymer obtained in Example 11, 1.0 g, was dissolved in 6.0 g of cyclohexanone, which was passed through a Teflon® filter having a pore diameter of 0.2 μm. The solution was spin coated on a quartz substrate and heat treated at 90° C. for 60 seconds, forming a thin film of 500 nm thick. The thin film was measured for transmittance at 193 nm using a UV-visible spectrophotometer, finding a transmittance of 80% across 500 nm. This result demonstrates that the polymer of the invention has a sufficient transparency as the photoresist base polymer for ArF excimer laser photolithography.

Example 14

Etching Resistance of Polymer

The polymer obtained in Example 11, 2 g, was dissolved in 10 g of cyclohexanone, which was passed through a Teflon® filter having a pore diameter of 0.2 μm. The solution was spin coated on a silicon wafer and heat treated at 90° C. for 60 seconds, forming a thin film of 700 nm thick. Using a reactive ion etching apparatus, the thin film was etched with $CF_4$ gas under conditions: power 100 W, pressure 5 Pa, and gas flow rate 30 ml/min. As a result, the etching rate was 1.13 based on a rate of 1.00 normalized for novolac resist. For comparison purposes, the same test was done on poly (p-hydroxystyrene) used as the base polymer for KrF resist, finding an etching rate of 1.20. These results demonstrate that the inventive polymer has a slower etching rate with $CF_4$ gas, that is, better dry etching resistance.

There have been described polymerizable ester compounds having a sulfonamide structure which are very advantageous as monomers to base polymers in improving both the resolution and etching resistance of resists. The polymers obtained therefrom have improved transparency, especially at the exposure wavelength of an excimer laser and dry etching resistance. Resist compositions comprising the inventive polymers are sensitive to high-energy radiation, have a high resolution, and lend themselves to micropatterning with electron beams or deep-UV rays. Because the pattern collapse by swelling during development is minimized, finely defined patterns can easily be formed. The resist compositions are thus suitable as micropatterning material for VLSI fabrication.

Japanese Patent Application No. 2003-167524 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:
1. A polymerizable ester compound having the general formula (3):

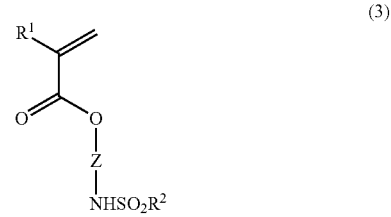

(3)

wherein $R^1$ is hydrogen, methyl or trifluoromethyl, $R^2$ is a straight, branched or cyclic alkyl group of 1 to 10 carbon atoms in which some or all of the hydrogen atoms may be substituted with halogen atoms, and Z is

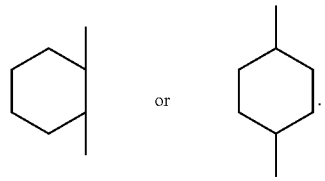

2. A polymer comprising recurring units of the following general formula (3a) and having a weight average molecular weight of 2,000 to 100,000,

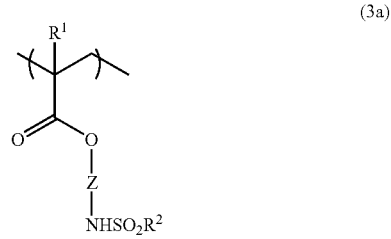

(3a)

wherein $R^1$ is hydrogen, methyl or trifluoromethyl, $R^2$ is a straight, branched or cyclic alkyl group of 1 to 10 carbon atoms in which some or all of the hydrogen atoms may be substituted with halogen atoms, Z is

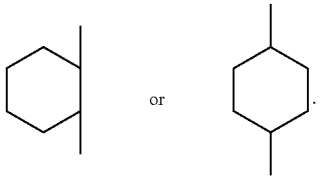 or .

3. The polymer of claim 2, further comprising recurring units of at least one type having the general formula (4a):

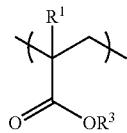

(4a)

wherein $R^1$ is hydrogen, methyl or trifluoromethyl, and $R^3$ is a tertiary alkyl group of 4 to 20 carbon atoms which may contain a hydroxyl, carbonyl, ester or ether group.

4. The polymer of claim 3, further comprising recurring units of at least one type having the general formula (5a):

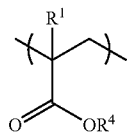

(5a)

wherein $R^1$ is hydrogen, methyl or trifluoromethyl, and $R^4$ is an alkyl group of 2 to 20 carbon atoms which contains a hydroxyl, carbonyl, ester, ether or cyano group.

5. The polymer of claim 2, wherein the recurring unit of formula (3a) are present in a molar fraction of at least 5%.

6. A resist composition comprising the polymer of claim 2.

7. A resist composition comprising
   (A) the polymer of claim 2,
   (B) a photoacid generator, and
   (C) an organic solvent.

8. A resist composition comprising
   (A) the polymer of claim 2,
   (B) a photoacid generator,
   (C) an organic solvent, and
   (D) a basic compound.

9. A process for forming a resist pattern comprising the steps of:
   applying the resist composition of claim 6 onto a substrate to form a coating, heat treating the coating and then exposing it to high-energy radiation having a wavelength of up to 300 nm or electron beams through a photomask, and heat treating the exposed coating and developing it with a developer.

* * * * *